United States Patent
Liu

(10) Patent No.: US 12,126,367 B2
(45) Date of Patent: *Oct. 22, 2024

(54) METHOD AND SYSTEM FOR COMPRESSING APPLICATION DATA FOR OPERATIONS ON MULTI-CORE SYSTEMS

(71) Applicant: Cornami, Inc., Dallas, TX (US)

(72) Inventor: Tianfang Liu, Santa Clara, CA (US)

(73) Assignee: Cornami, Inc., Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/178,237

(22) Filed: Mar. 3, 2023

(65) Prior Publication Data

US 2023/0216519 A1 Jul. 6, 2023

Related U.S. Application Data

(63) Continuation of application No. 16/752,239, filed on Jan. 24, 2020, now Pat. No. 11,599,367.

(51) Int. Cl.
*H03M 7/30* (2006.01)
*G06F 7/483* (2006.01)
(Continued)

(52) U.S. Cl.
CPC .......... *H03M 7/3059* (2013.01); *G06F 7/483* (2013.01); *G06F 9/445* (2013.01); *G06F 18/2135* (2023.01); *G06F 18/24* (2023.01); *G06N 3/02* (2013.01); *G06N 3/0464* (2023.01); *G06V 10/764* (2022.01); *G06V 10/7715* (2022.01);
(Continued)

(58) Field of Classification Search
CPC ....... G06F 9/445; G06F 7/483; G06K 9/6247; G06K 9/6267; G06N 3/02; H03M 7/40; H03M 7/6005; H03M 7/6011
See application file for complete search history.

(56) References Cited

U.S. PATENT DOCUMENTS 11,599,367 B2 * 3/2023 Liu .......... G06F 7/483

FOREIGN PATENT DOCUMENTS

WO   WO 2020/190772   * 9/2020 ............. G06N 20/00

OTHER PUBLICATIONS

Sainath et al, "Low-Rank Matrix Factorization for Deep Neural Network Training With High-Dimensional Output Targets", 2013, IEEE international conference on acoustics, speech and signal processing, pp. 6655-6659 (5 pages) (Year: 2013).*

* cited by examiner

*Primary Examiner* — David F Dunphy
(74) *Attorney, Agent, or Firm* — NIXON PEABODY LLP

(57) ABSTRACT

A system and method to compress application control data, such as weights for a layer of a convolutional neural network, is disclosed. A multi-core system for executing at least one layer of the convolutional neural network includes a storage device storing a compressed weight matrix of a set of weights of the at least one layer of the convolutional network and a decompression matrix. The compressed weight matrix is formed by matrix factorization and quantization of a floating point value of each weight to a floating point format. A decompression module is operable to obtain an approximation of the weight values by decompressing the compressed weight matrix through the decompression matrix. A plurality of cores executes the at least one layer of the convolutional neural network with the approximation of weight values to produce an inference output.

19 Claims, 8 Drawing Sheets

(51) Int. Cl.
  *G06F 9/445* (2018.01)
  *G06F 18/2135* (2023.01)
  *G06F 18/24* (2023.01)
  *G06N 3/02* (2006.01)
  *G06N 3/0464* (2023.01)
  *G06V 10/764* (2022.01)
  *G06V 10/77* (2022.01)
  *G06V 10/82* (2022.01)
  *H03M 7/02* (2006.01)
  *H03M 7/40* (2006.01)

(52) U.S. Cl.
  CPC .............. *G06V 10/82* (2022.01); *H03M 7/02* (2013.01); *H03M 7/40* (2013.01); *H03M 7/6005* (2013.01); *H03M 7/6011* (2013.01); *H03M 7/70* (2013.01)

| FC1000 of ResNet50 at Onnx | | FP32 | FP4 (normalized) | FP4 (normalized, 1 sign, 3 exp, 0 man) |
|---|---|---|---|---|
| | fac | | 1 | 0.2 |
| | weight shape | [2048 10000] | [2048 10000] | [2048 10000] |
| | weight count | 2048000 | 2048000 | 2048000 |
| | size in byte | 8192000 | 8192000 | 8192000 |
| SVD decomposition | compressed weight shape | | | [2048 200] |
| | compressed weight size in byte | | | 1638400 |
| | decompression matrix shape | | | [200 1000] |
| | decompression matrix size in byte | | | 800000 |
| | size in byte | | 8192000 | 2438400 |
| | compression ratio | 1 | 1 | 3.359580052 |
| FP4 compression | size in byte | | 1024000 | 304800 |
| | compression ratio | | 8 | 8 |
| | normalized MSE | | 0.028729 | |
| Huffman compression | compressed weight bit count | | 5262110 | 1219760 |
| | compressed weight byte count | | 657764 | 152470 |
| | decompression matrix bit count | | 0 | 688535 |
| | decompression matrix byte count | | 0 | 86066.875 |
| | total size in byte | | 657764 | 238537 |
| | compression ratio | 1 | 1.556789957 | 1.27778986 |
| | total compression ratio | 1 | 12.45431966 | 34.34269859 |
| | Accuracy of top one category | 74.2780% | 73.5640% 0.96% | 71.3480% 3.94% |
| | Accuracy of top five categories | 92.2040% | 91.9380% 0.29% | 90.5660% 1.78% |

FIG. 7A

| 750 | | fc6 | FC6 of VGG19 | | | |
|---|---|---|---|---|---|---|
| | | | FP32 | | FP4, normalized | |
| 760 | | weight shape | [25089 4096] | [25089 4096] | [25089 4096] | [25089 4096] |
| | | weight count | 102764544 | 102764544 | 102764544 | 102764544 |
| | | size in byte | 411058176 | 411058176 | 411058176 | 411058176 |
| 770 | SVD decomposition | compressed weight shape | | [4096 2509] | [4096 1254] | [4096 502] |
| | | compressed weight size in byte | | 41105818 | 20552909 | 8221164 |
| | | decompression matrix shape | | [2509 25089] | [1254 25089] | [502 25089] |
| | | decompression matrix size in byte | | 251783168 | 125891584 | 50356634 |
| | | size in byte | | 292888986 | 146444493 | 58577797 |
| | | compression ratio | | 1.403460682 | 2.806921364 | 7.017303409 |
| 772 | FP4 compression | size in byte | | 36611123 | 18305562 | 7322225 |
| | | compression ratio | | 8 | 8 | 8 |
| 774 | Huffman compression | compressed weight bit count | | 161662537 | 80986275 | 31173225 |
| | | compressed weight byte count | | 20207817 | 10123284 | 3896653 |
| | | decompression matrix bit count | | 25814344 | 12927032 | 5168304 |
| | | decompression matrix byte count | | 3226793 | 1615879 | 646038 |
| | | total size in byte | | 23434610 | 11739163 | 4542691 |
| | | compression ratio | 1 | 1.56226722 | 1.559358281 | 1.611869363 |
| | | total compression ratio | 1 | 17.54064496 | 35.01596859 | 90.48781101 |
| | | Accuracy of top one category | 72.38% | 71.99% | 69.67% | 69.54% |
| | | Accuracy of top five categories | 90.88% | 90.69% | 89.42% | 89.41% |

FIG. 7B

METHOD AND SYSTEM FOR COMPRESSING APPLICATION DATA FOR OPERATIONS ON MULTI-CORE SYSTEMS

PRIORITY

The present application is a continuation of U.S. patent application Ser. No. 16/752,239 filed Jan. 24, 2020, which is hereby incorporated by reference in its entirety.

TECHNICAL FIELD

The present disclosure relates generally to applications run by multi-core systems. More particularly, aspects of this disclosure relate to techniques to compress application data such as weights for a neural network application with operations distributed on a multi-core system for execution.

BACKGROUND

Computing systems are increasing based on homogeneous cores that may be configured for different executing applications. Thus, such cores may be adapted for many different operations and be purposed for various parallel programming tasks. The cores are typically fabricated on a die. Such dies may be fabricated so they may be divided to allocate the needed processing power. The processing performed by such dies thus relies on many cores being employed to divide programming operations. One example of such division may be a streaming model of programming multiple cores that employs different threads that are assigned to different cores.

The multiple cores may be programmed for applications such as image classification using machine learning, as the cores may be configured to provide outputs from determinations of weights and different input feature data. The multiple cores are beneficial for such an application because parallel operations may be assigned to different cores for simultaneous execution. For example, groups of cores may be assigned to each layer of the neural net to apply weights to the input feature data to classify the image.

Deep learning is a branch of machine learning. Like machine learning, deep learning involves a training process and an inference process. Training is the process to capture the features of a given training dataset. The outcome of training is a trained model, convolutional neural network (CNN), deep neural network (DNN) or other computer modeled outcome. The captured features are reflected as the weights of each layer in the model. For example, in image classification applications, a model may be trained by a training set of images with specific features. The weights for the captured features are learned by the model and stored.

Given the trained model, inference is the process to make predictions on an unknown dataset based on the weights determined during the training process. Thus, once the weights are obtained from the training process in an image classification model, they are stored and made available for analysis of an unknown set of images. Using the weights determined in training in relation to detected features of the unknown set of images, the unknown images may be classified by the model.

In complex applications, such as image classification, deep learning models learn the deep knowledge about features of training dataset of images. Sophisticated CNNs have been developed to accurately classify images based on multiple input data. These CNNs have relatively large number of layers and each layer has large dimensions based on the complexity of image classification. The consequence is that more storage space and computation power are needed for the inferences produced from such sophisticated CNN models. For example, a ResNet50 convolutional neural network model has 50 layers. There are about an average of 6,656K weights for each layer in the ResNet 50 convolutional neural network model. The overall number of weights for the models is over 23 million values. If each weight is represented as a 32-bit single precision floating-point number, the ResNet50 model requires about 26M bytes of storage space to save the weights for the processing cores that execute the model.

Such predictions based on the stored weights usually occur on a multi-core network edge device because for security and bandwidth purposes, there is no need to transfer data over the cloud for computation. Further, the computation performed on edge based devices results in a much shorter response time in comparison to cloud-based servers. However, typically edge devices have limited storage space and computation capability. Thus, the amount of storage space needed for the stored weights for evaluating an unknown dataset becomes a critical impediment to rapid operation by edge devices in a multi-core system. As explained above, numerous weight values are typically used for each of the layers in a convolutional neural network model and therefore overwhelm the limited storage space available for an edge device that executes the model.

In order to effectively run such a model on an edge device, each layer of the model must be compressed before it is saved on an edge device. The compressed layers are then decompressed before running the inference process on the edge device.

Thus, there is a need for reducing the amount of storage space for operational data such as weights required for an artificial learning application. There is also a need for compressing the weights of a convolutional neural network model to produce an approximation of the weights that may be used to maintain the performance of inference outputs without re-training the model. There is a further need for compression and decompression of weights for layers of a convolutional neural network model that allows maintaining prediction accuracy of the model at an acceptable level on an edge device.

SUMMARY

One disclosed example is a multi-core system for executing at least one layer of a convolutional neural network. The system includes a storage device storing a compressed weight matrix of a set of weights of the at least one layer of the convolutional network. The compressed weight matrix is formed by quantization of a floating point format of each weight to a floating point composite. A decompression module is operable to obtain an approximation of the weight values by expanding the floating point composites of each weight to an approximation of each weight value. A plurality of cores executes the at least one layer of the convolutional neural network with the approximation of weight values to produce an inference output.

Another disclosed example is a method of compression of a set of weights for a layer of a convolutional neural network. The set of weights is compressed by quantization of a floating point format of each weight to a floating point composite. The compressed set of weights and the is stored in a storage device of a multi-core device configured to execute the convolutional neural network.

Another disclosed example is a method of image classification. Matrix factorization of a set of weights of a convolutional neural network image classification model is performed to produce a decompression matrix and a set of factorized weights for the quantization. The set of weights is compressed by quantization of a floating point format of each weight to a floating point composite. The compressed set of weights and decompression matrix are stored in a storage device of a multi-core device. An approximation of the weight values is determined by decompressing the compressed weight matrix through the decompression matrix and expanding the floating point composites of each weight. The features of an unknown image are input to the convolutional neural network image classification model. The layer of the convolutional neural network model is executed by a plurality of cores of the multi-core device with the approximation of weight values to produce an inference output classifying the unknown image.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 7A is a table summarizing the results of the disclosed process of compression and decompression applied to FC1000 of a ResNet50 image classification network; and FIG. 7B is a table summarizing the results of the disclosed process of compression and decompression applied to a FC6 of a VGG19 image classification network.

Figure 1A:
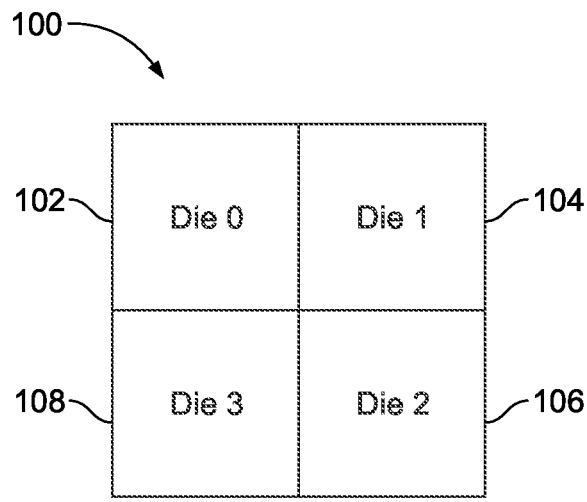
FIG. 1A is a diagram of a chip having four dies each having multiple processing cores that may execute a convolutional neural network model.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of" or "within acceptable manufacturing tolerances," or any logical combination thereof, for example.

The present disclosure is directed toward a system and method of compressing control data such as weight data in a learned image classification model. The compression process includes a stage of matrix refactoring, a compress (quantization) stage and a lossless encoding stage to produce a compressed set of weights for the model. The compression process thus produces a compressed weights file and a decompression matrix. The compressed weights file and decompression matrix is stored by the multi-core system. When the image classification model is performed by the multi-core system, the system will decompress the compressed weights file using the decompression matrix. The decompression process includes lossless decoding, an expand (quantization) stage and a matrix restoration stage to obtain the weights from image classification process.

FIG. 1A shows an example chip 100 that is subdivided into four identical dies 102, 104, 106, and 108. Each of the dies 102, 104, 106, and 108 include multiple processor cores, support circuits, serial interconnections and serial data control subsystems. For example, the dies 102, 104, 106, and 108 may each have 4,096 processing cores as well as SERDES interconnection lanes to support different communication protocols. There are die to die parallel connections between the dies 102, 104, 106 and 108. Thus, each of the dies 102, 104, 106, and 108 in this example are interconnected by Interlaken connections. The chip 100 is designed to allow one, two or all four of the dies 102, 104, 106, and 108 to be used. The pins on a package related to un-used dies are left unconnected in the package or the board. The dies are scalable as additional chips identical to the chip 100 may be implemented in a device or a circuit board. In this example, a single communication port such as an Ethernet port is provided for the chip 100. Of course, other ports may be provided, such as one or more ports for each die.

Figure 1B:
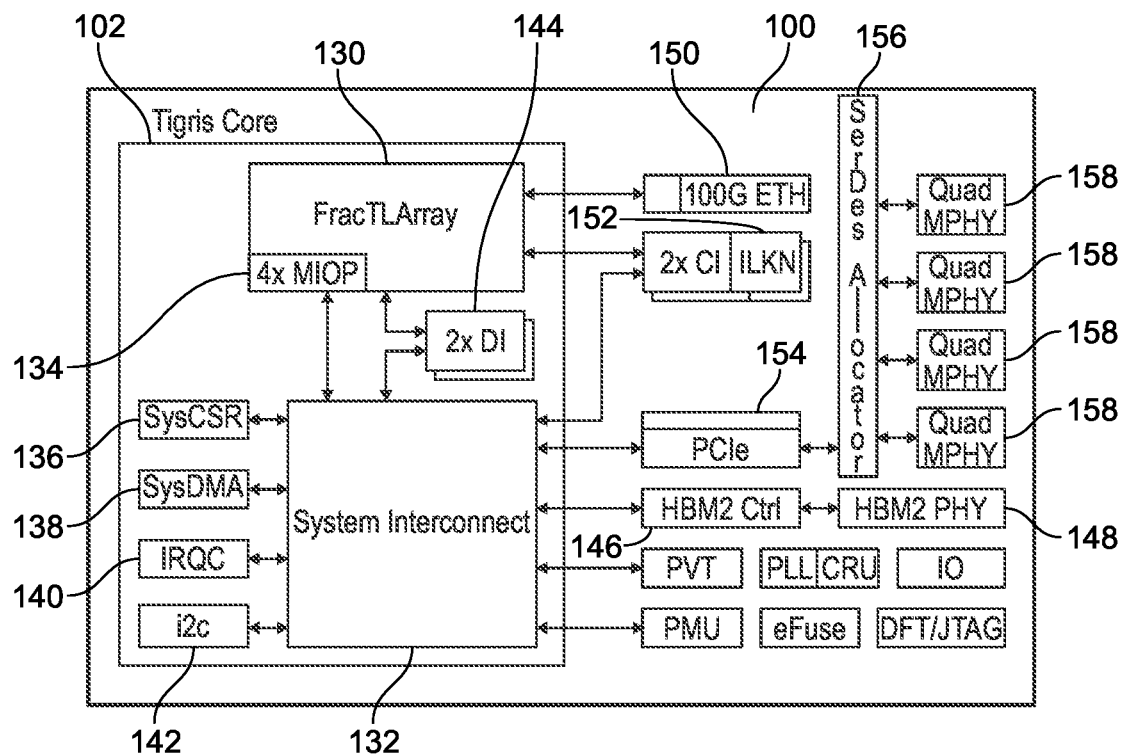
FIG. 1B is a simplified diagram of one of the dies on the chip shown in FIG. 1A.

FIG. 1B is a block diagram of one example of the die 102. The die 102 includes a fractal array 130 of processing cores. The processing cores in the fractal array 130 are interconnected with each other via a system interconnect 132. The entire array of cores 130 serves as the major processing engine of the die 102 and the chip 100. In this example, there are 4096 cores in the array 130 that are organized in a grid.

The system interconnection 132 is coupled to a series of memory input/output processors (MIOP) 134. The system interconnection 132 is coupled to a control status register (CSR) 136, a direct memory access (DMA) 138, an interrupt controller (IRQC) 140, an I2C bus controller 142, and two die to die interconnections 144. The two die to die interconnections 144 allow communication between the array of processing cores 130 of the die 102 and the two neighboring dies 106 and 104 in FIG. 1A.

The chip includes a high bandwidth memory controller 146 coupled to a high bandwidth memory 148 that constitute an external memory sub-system. The chip also includes an Ethernet controller system 150, an Interlaken controller system 152, and a PCIe controller system 154 for external communications. In this example each of the controller systems 150, 152, and 154 have a media access controller, a physical coding sublayer (PCS) and an input for data to and from the cores. Each controller of the respective communication protocol systems 150, 152, and 154 interfaces with the cores to provide data in the respective communication protocol. In this example, the Interlaken controller system 152 has two Interlaken controllers and respective channels. A SERDES allocator 156 allows allocation of SERDES lines through quad M-PHY units 158 to the communication systems 150, 152 and 154. Each of the controllers of the communication systems 150, 152, and 154 may access the high bandwidth memory 146.

In this example, the array 130 of directly interconnected cores are organized in tiles with 16 cores in each tile. The array 130 functions as a memory network on chip by having a high-bandwidth interconnect for routing data streams between the cores and the external DRAM through memory IO processors (MIOP) 134 and the high bandwidth memory controller 146. The array 130 functions as a link network on chip interconnection for supporting communication between distant cores including chip-to-chip communication through an "Array of Chips" Bridge module. The array 130 has an error reporter function that captures and filters fatal error messages from all components of array 130.

Figure 2A:
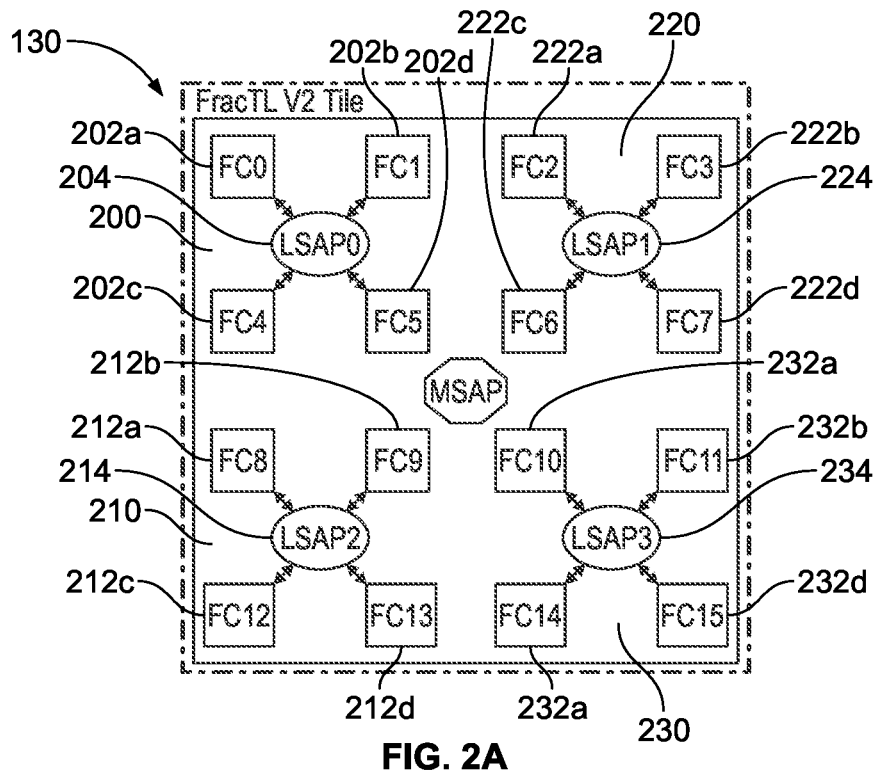
FIG. 2A is a block diagram of some of the cores of the array of cores in the die in FIG. 1B.
Figure 2B:
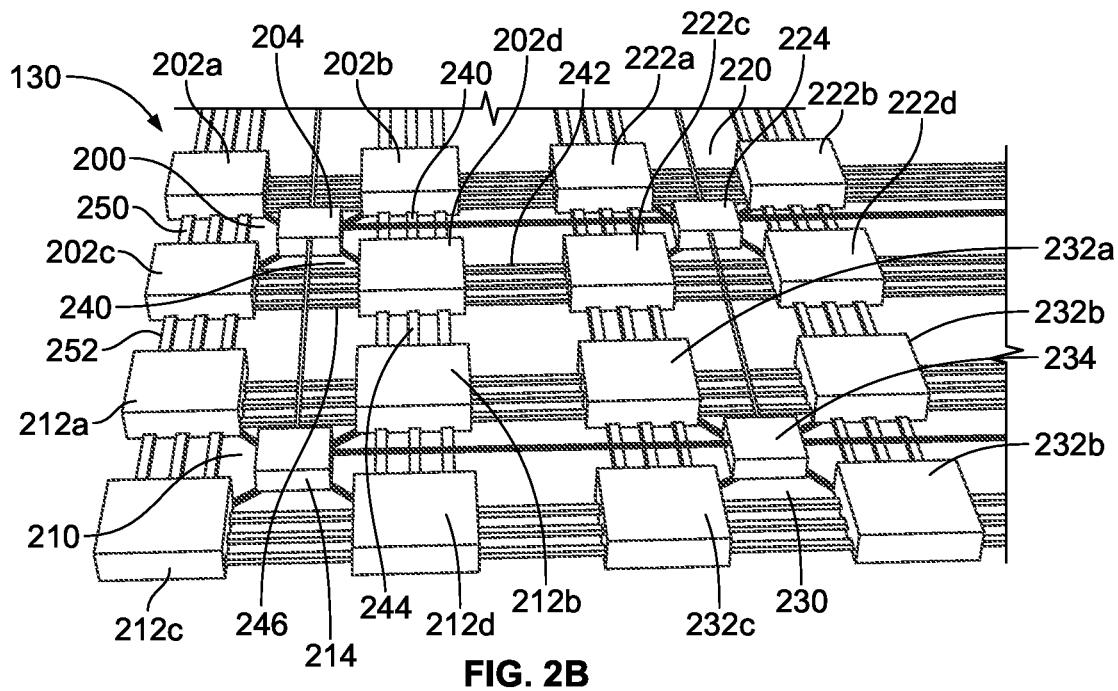
FIG. 2B is a three-dimensional view of the array of cores shown in FIG. 2A of the die in FIG. 1B.

FIG. 2A is a detailed diagram of the array of cores 130 in FIG. 1B. FIG. 2B is a three-dimensional image of the array of cores 130 in FIG. 1B. The array of cores 130 is organized into four core clusters such as the clusters 200, 210, 220, and 230 shown in FIG. 2A. For example, the cluster 200 includes cores 202a, 202b, 202c, and 202d. Each of the four cores in each cluster 200 such as cores 202a, 202b, 202c, and 202d are coupled together by a router 204. FIG. 2B shows other clusters 210, 220, and 230 with corresponding cores 212a-212d, 222a-212d and 232a-232d and corresponding routers 214, 224, and 234.

As may be seen specifically in FIG. 2B, in this example, each of the cores 202a, 202b, 202c, and 202d has up to four sets of three interconnections. For example, a core in the center of the array such as the core 202d includes four sets of interconnections 240, 242, 244, and 246 each connected to one of four neighboring cores. Thus core 202b is connected to the core 202d via the interconnections 240, core 202c is connected to the core 202d via the interconnections 242, core 212b is connected to the core 202d via the interconnections 244, and core 202c is connected to the core 202d via the interconnectors 246. A separate connector 248 is coupled to the wire router 204 of the cluster 200. Thus each core in the middle of the array, has four sets of interconnections, while border cores such as the core 202c only have three sets of interconnections 250, 252, and 246 that are connected to respective cores 202a, 202d, and 212a.

Figure 3:
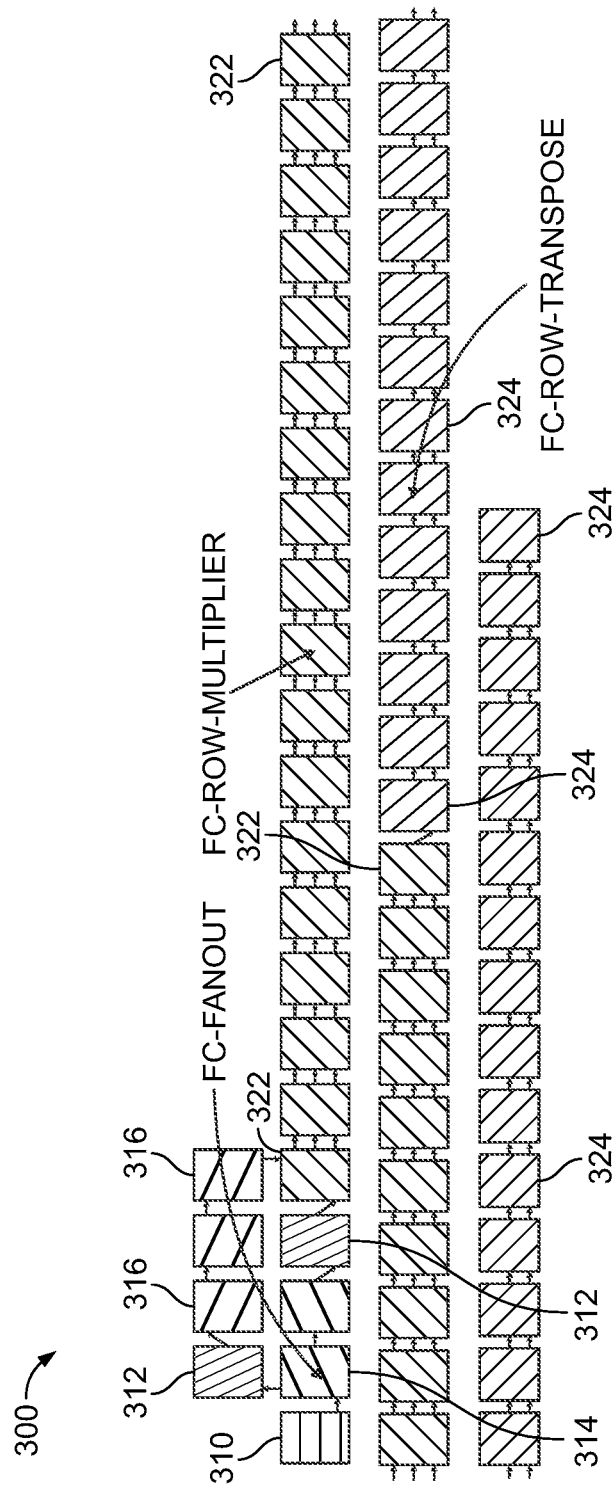
FIG. 3 is a diagram of an example array of cores configured for matrix multiplication for use in a convolutional neural network.

The array of cores 130 in FIG. 1B may be programmed as a convolutional neural network (CNN) for specific applications such as image classification. For example, in image classification, each of the cores are part of a convolutional layer or a fully connected layer of the model. The kernel arithmetic operation of each layer is matrix multiplication. FIG. 3 shows a layout 300 of certain cores of an array of cores 130 configured for matrix multiplication for a layer of a convolutional neural network model. Convolutional layers of the CNN may be output as a matrix through the evaluation of input values and weights. In this example, the inputs are features of an unknown image.

One of the cores is configured as an input interface 310 to accept the decompressed weight approximation values from the decompression module as will be explained below. One of the cores is configured for a fractal core fanout 310 that converts the one dimensional data (weights and inputs) into a matrix format. Two of the cores are configured as first in first out (FIFO) buffers 312 for the weights and the inputs respectively. Several additional cores 316 serve as connectors between other cores in the layout 300.

In this example, the inputs constitute two matrix sizes (M×N) and (N×P) for the inputs and weights respectively. The desired output is a matrix having the size of M×P. One set of cores serves as a fractal core row multiplier 322. Another set of cores constitutes a fractal core row transposer 324. Thus, each of the row multipliers 322 provide multiplication and the row transposers transpose the results to rows in the output matrix. In this example the output matrix is 28×28, and thus 28 cores are used for the row multipliers 322 and 28 cores are used for the row transposers 324.

Once a convolutional neural network model is programmed into the array of cores 130 and corresponding interconnections, a compressed file of weights and a decompression matrix may be stored in common memory, such as the high bandwidth memory 148 in FIG. 1B, for each of the layers of the CNN. When the CNN model for image classification is executed, the cores 130 decompress an approximation of the weights from the compressed file of weights using the decompression matrix as will be described below. The approximation of the weights is then streamed to the cores for execution of the particular layer of the CNN model. Thus, the model may accept feature input data from unknown images, and produce classification inference outputs through execution of the layers and associated weights.

The disclosed system and method allow compression of control data such as weights for multi-core operations related to applications such as a CNN model for image classification. The image classification convolution neural network is programmed to run on the array of cores 130 in FIG. 1B. The convolutional neural network has a number of layers with an associated set of weights. Input feature data from an unknown image are evaluated by the layers of the network to produce image classification outputs based on inferences produced by the layers and respective sets of weights.

Thus, each of the cores 130 may apply one or more of the weights for an input or input for one of the layers of the image classification application. To run an inference process based on a CNN model for image classification on an edge device such as a device that incorporates the cores of the array of cores 130, each layer of the model must be compressed before it is saved on an edge device, and compressed layers must be decompressed before running the inference process. The disclosed process allows compressing the model and maintaining the performance of the inference output without having to re-train the model to maintain the model performance (prediction accuracy). Thus, the compression results in lower latency and increase in processing by edge devices of the image classification application. The techniques exploited are matrix refactorization, quantization, and lossless compression.

The compression of control data, such as weights for one layer of a convolutional neural network (CNN), includes matrix factorization, compress (quantization) and lossless encoding. The compression process is performed on the weights of each layer of the CNN model separately in this example. The compression process includes the stages of matrix refactoring, compression (quantization), and lossless encoding. Thus, a compressed encoded matrix of weights is produced and stored for each layer of the CNN. Once, the CNN is executed, a decompression routine is performed. The decompression process is performed for the compressed encoded matrix of weights for each layer. The decompression process includes the stages of lossless decoding, expansion (quantization), and matrix restoration.

Figure 4:
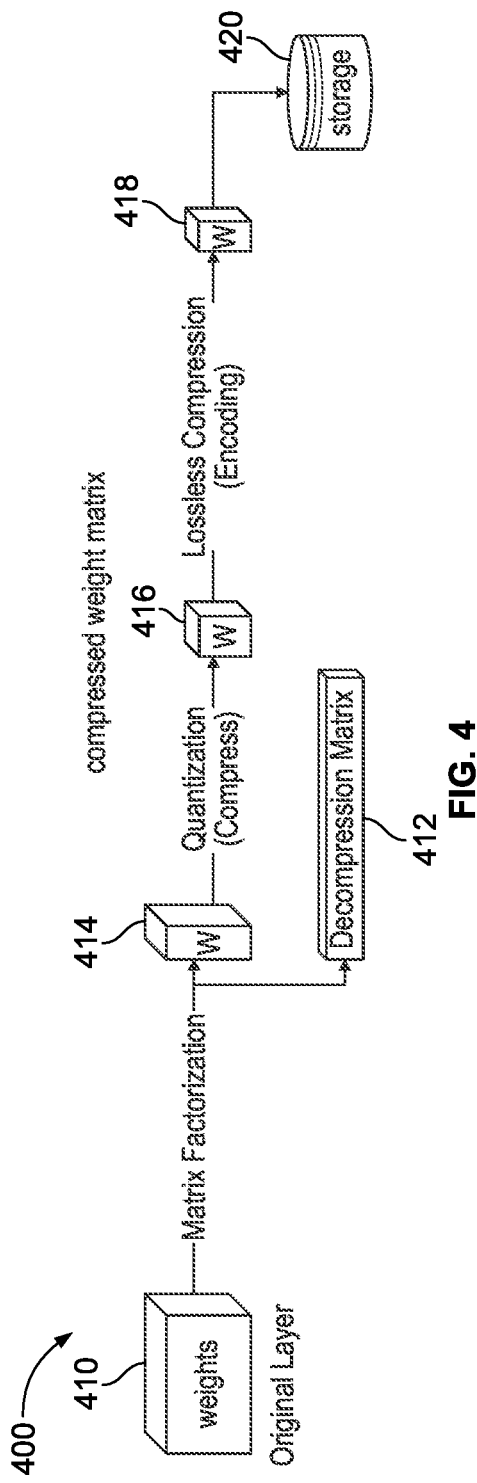
FIG. 4 is a diagram of the process of compressing weight data of a layer of a convolutional neural network model into an encoded compressed weight matrix.

FIG. 4 shows an example process diagram 400 for the compression of control data such as a set of weights 410. In this example, the set of weights are the weights for one layer for a CNN for image classification. The set of weights is generally determined through the training process using a training dataset. As explained above, each layer of the CNN has an associated set of weights. The process 400 performs matrix factorization of the set of weights 410. The matrix factorization process produces a decompression matrix 412 and a set of factorized weights 414. The factorized weights 414 are compressed by quantization and a compressed weight matrix 416 is produced. The compressed weight matrix 416 is encoded to an encoded compressed weight data 418. The encoded compressed weight data 418 is stored in a storage device 420. In this example, the storage device 420 may be memory, such as the high bandwidth memory 148 in FIG. 1B, that is accessible by multiple cores in a multi-core system that executes the CNN.

In relation to the matrix factoring process producing the factorized weights 414, it has been observed that the weight matrix of many layers in a CNN for image classification are sparse matrices. The dimension of such sparse matrices could be reduced by applying singular value decomposition or principal components analysis. In this example, the matrix factorized weights 414 are reduced by singular value decomposition. The outcome of singular value decomposition is the compressed weight matrix 416 and the decompression matrix 412. The decompression matrix 412 is used to restore the compressed weights in the weight matrix.

Typically, each element of the weight matrix is represented by a 32-bit single-precision floating-point number. Per the IEEE754 standard, the 32-bit single-precision floating-point format includes a sign bit, 8 exponent bits, and 23 mantissa bits. A single-precision floating-point number in this format thus occupies four-byte storage space and provides superior precision over very wide dynamic range. Alternatively, in other applications, network control values may be represented in fixed-point format, which has limited dynamic range and precision. Fixed-point format is not commonly used for image classification.

Figure 5A:
FIG. 5A is a table showing the precision of quantization of floating point values over a wide dynamic range.

FIG. 5A is a table 500 showing the precision of quantization of values over a wide dynamic range. The table 500 shows a set of layers in each of the rows for an example of ResNet CNN architecture. Each of the rows in the table 500 represents one sublayer. Each row contains the kernel size, number of kernels, and stride numbers for the particular layer. The row entries also contain information for each sub-layer. The columns of the table 500 represent different numbers of layers and the corresponding FLOPs at the bottom of the table 500 represent the number of floating point operations required to evaluate each of the different numbers of layers of the whole model.

For example, the column labeled as "50-layer" is for the ResNet50 architecture. The output size for the first sublayer (conv1) is 112×112 and uses 64 7×7 dimension filters/kernels and a stride over the image of 2. For the fifth sublayer (conv5), the output is 7×7 using three groups of 512 1×1 dimension filters/kernels, 512 3×3 dimension filters/kernels, and 2048 1×1 dimension filters/kernels.

The histogram of elements of an example weight matrix shows that values of the weights are in a limited rage and centralized to a "mean" value. Each weight thus may be normalized and quantized (compressed) to a special floating-point format. This, each weight may be expressed by a 32-bit single-precision floating-point format number, which may be compressed into a four-bit floating-point composite. Such a floating-point composite is a composite of one sign bit and three exponent bits. The quantization on this stage thus achieves 8X compression ratio from the original 32-bit floating number to the four-bit floating-point composite. The same fact holds for the compressed weight matrix and the decompression matrix, which are the outcome of singular value decomposition.

Figure 5B:
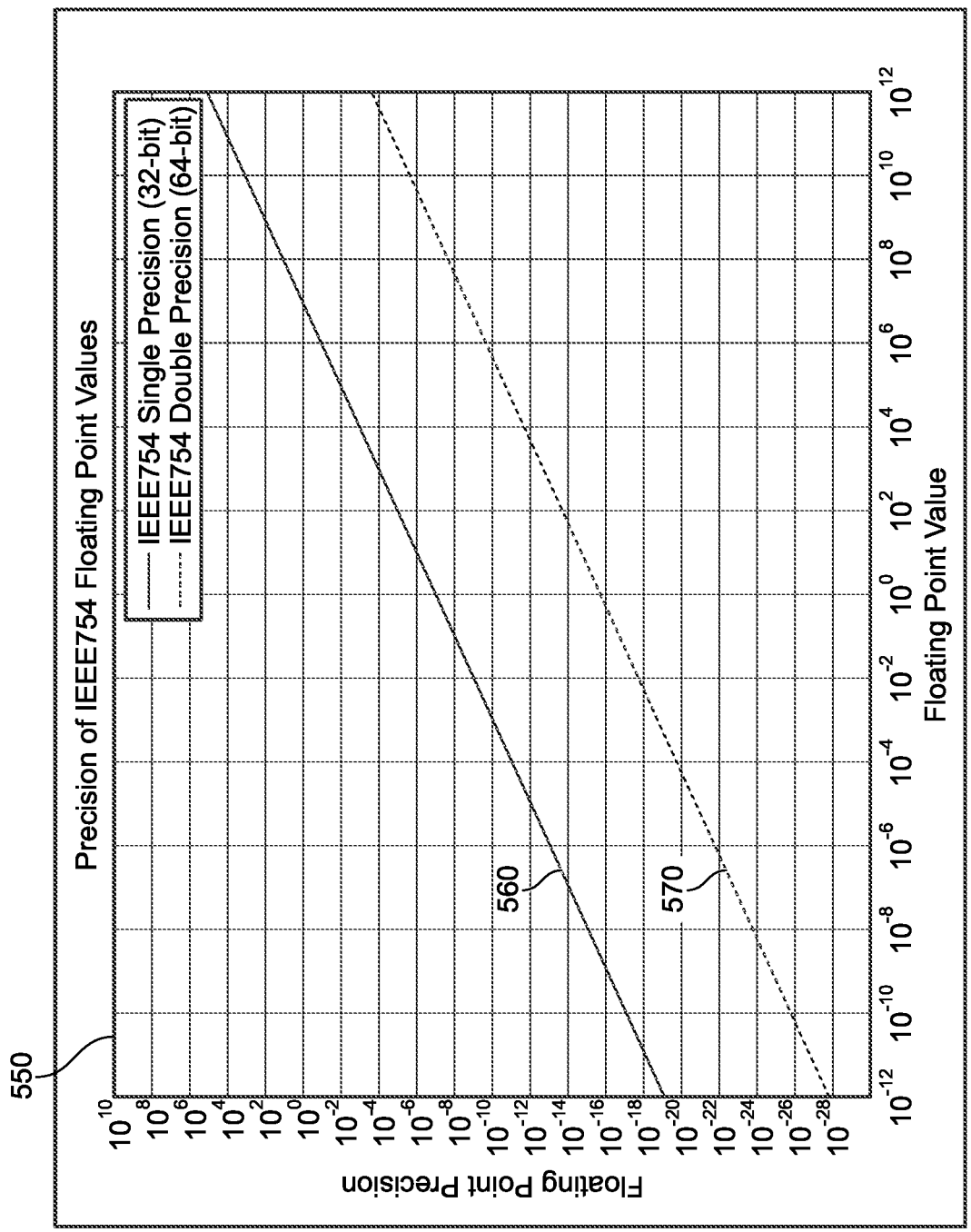
FIG. 5B is a graph showing the precision of floating point values according to the IEEE754 standard.

FIG. 5B is a graph 550 that shows the precision of single precision and double precision of IEEE754 floating point values in a range of $10^{-12}$ to $10^{12}$. The graph 550 shows a line 560 representing single precision (32-bit) values and a line 570 representing double precision (64-bit) values.

Referring back to FIG. 4, to achieve the largest compression ratio, the quantized weight matrix 416 is further compressed by Hoffman encoding in this example to produce the encoded compression weight matrix 418. The encoded compression weight matrix 418 and the decompression matrix 412 are stored in a memory. Thus, each of the layers of the CNN have a corresponding encoded compression weight matrix such as the encoded compression weight matrix 418 and a decompression matrix such as the decompression matrix 412. When the CNN is executed, a decompression routine is executed on the encoded compression weight matrix to produce the set of weights for each layer that may be used by the cores when executing the CNN.

Figure 6:
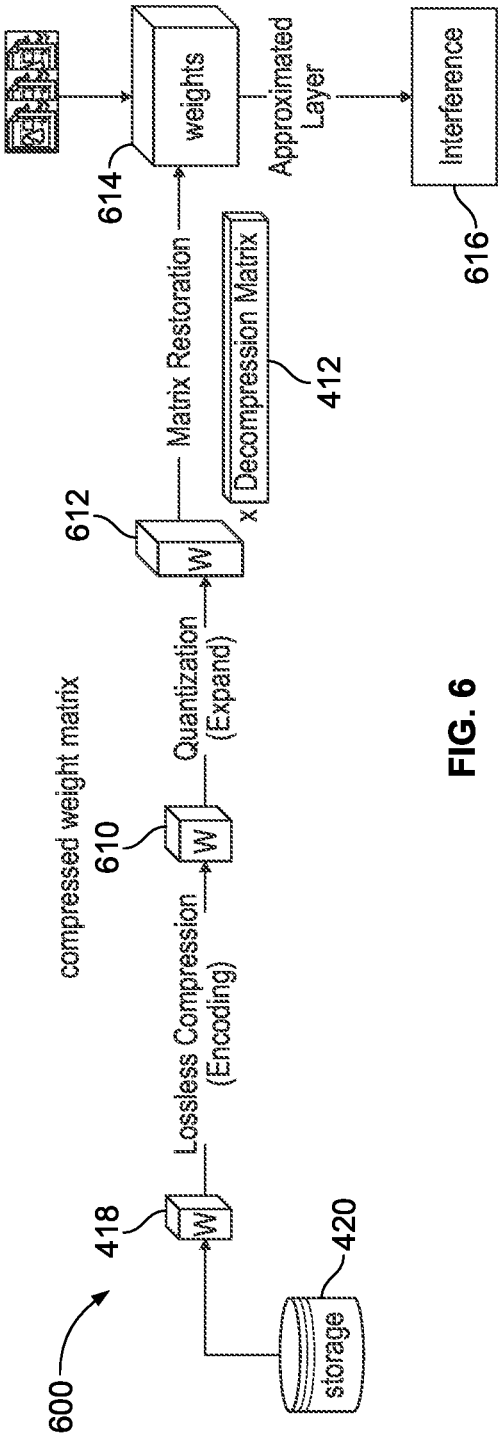
FIG. 6 is a diagram of the process of decompressing an encoded compressed weight matrix for application by a layer of a convolutional neural network.

The decompression process includes a lossless decoding process stage, an expand stage and a matrix restoration stage. An example decompression process 600 is shown in FIG. 6. The decompression process is performed on the encoded compression weight matrix of each layer of the CNN model separately. In this example, the decompression process 600 may be performed by one of cores or multiple cores of the array of cores 130 in the system 100. Such a core or cores may be programmed as a decompression module to obtain an approximation of the weight values from the encoded compression weight matrix for each layer. Alternatively, the decompression process 600 may be performed by a specialized circuit such as an ASIC or FPGA. The approximation of the weight values for each layer of the CNN model are then used for the execution of the CNN to produce inference outputs. Thus, inputs from an image may be evaluated by the layers of the CNN executed by the array of cores 130 to produce an interference output of image classification.

As explained above, the encoded compression weight matrix is stored in the storage device 420. The encoded compression weight matrix 418 is read from the storage device 420. A lossless decoding process, which is Hoffman decoding in this example, is applied to the compression weight matrix to produce the compressed weight matrix 610. The weight elements in the 4-bit floating-point composite are expanded to 32-bit single-precision floating-point format based on quantization to produce a compressed weight matrix 612. An approximation 614 of the set of weights from the weight matrix 612 is achieved by multiplying the compressed weight matrix 612 with the decompression matrix 412. The approximation 614 of the weights of the weight matrix is used for the layer of the CNN to produce an interference output 616.

One example of the disclosed method is an application of the compression and decompression of a pipeline FC1000 layer of the image classification ResNet50 model and loaded using the ResNet50 function from Neural Network Toolbox. FIG. 7A is a summary table 700 of the results of the compression and decompression of the FC1000 layer of the ResNet50 model according to the above explained process. A first set of rows 710 represent the weight shape, counts in bits in relation to floating point 32 bit values in a first column 720 and to floating point 4 bits values in a second set of columns 722. The first column 720 represents the situation when the weights are in 32-bit float-point format. It is used as benchmark for further comparison.

A second set of rows 730 represents the matrix factoring results when the example singular value decomposition is used. A third set of rows 732 represents the results of the quantization process. The quantization is to compress the weights in FP32 format to 4-bit floating-point format in the columns 722 (labeled as FP4 compression). A fourth set of rows 734 represents the results of the lossless encoding using Hoffman encoding.

The singular value decomposition is complete with different compression ratios (fac=1 and 0.2) as shown in column 722. The elements in the table contain the size of weight and bias, and the required space for storage in bytes of the FC1000 weights after each compression stage.

Another example of the disclosed method is an application of the compression and decompression of a FC6 layer of the VGG19 convolutional neural network. FIG. 7B is a summary table 750 of the results of the compression and decompression of the FC6 layer of the VGG19 convolutional neural network.

A first set of rows 760 represent the weight shape, counts in bits in relation to floating point 32 bit values in a first column 770 and to floating point 4 bit values in a second set of columns 772. The first column 770 represents the situation when the weights are in 32-bit float-point format. It is used as benchmark for further comparison.

A second set of rows 780 represents the matrix factoring results when the example singular value decomposition is used. A third set of rows 782 represents the results of the quantization process. The quantization is to compress the weights in FP32 format to 4-bit floating-point format in the columns 782 (labeled as FP4 compression). A fourth set of rows 784 represents the results of the lossless encoding using Hoffman encoding.

The singular value decomposition is complete with different compression ratios (fac=0.1, 0.05, and 0.02) as shown in column 772. The elements in the table contain the size of weight and bias, and the required space for storage in bytes of the FC6 weights after each compression stage.

The results of the testing summarized in the tables 700 and 750 show that a weight matrix may be compressed while the image classification model performance is maintained without retraining. Both of the tables 700 and 750 are based on performance evaluation criteria of the accuracy of the top one category and accuracy of the top five categories using an ImageNet validation dataset run through the respective models. The accuracy of top one category and top five categories in the tables 700 and 750 are to compare the performance after compression, with the benchmark. The top one accuracy is the conventional accuracy, which means that the model answer (the one with the highest probability) must be exactly the expected answer. The top five accuracy means that any of the model that gives the 5 highest probability answers that must match the expected answer. These are the typical parameters to evaluate performance of an image classification model.

After the compression according to the example methods described herein, the top-one accuracy is decreased by 3.94%, and top-five accuracy is decreased by 1.78% for the ResNet50 model. After the compression according to the example methods described herein, the top-one accuracy is decreased by 3.73% (72.38% to 69.67%), and top-five accuracy is decreased by 1.60% (90.88% to 89.43%) for the VGG19 model at fac=0.05.

As shown in FIGS. 7A-7B, the compression and decompression process allows the weights for each layer in a CNN model to be compressed without performance loss. The effective less weights that are determined because of the sparse matrix decreases the amount of computational power necessary to execute the CNN model.

The above principles are used in image classification examples, but may be applied to other machine learning problems where the weight matrix is a sparse matrix and the value of each element of the weight has a limited range.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A multi-core system for executing a layer of a convolutional neural network, the system comprising:
a storage device storing a compressed weight matrix of a set of weights of the at least one layer of the convolutional network and a decompression matrix, wherein the compressed weight matrix is formed by matrix factorization and quantization of a floating point format of each weight to a floating point composite;
a plurality of cores, wherein one of the plurality of cores is configured as a decompression module operable to obtain an approximation of the weight values by decompressing the compressed weight matrix by expanding the floating point composite of each weight to the floating point format; and wherein some of the plurality of cores are configured to execute the at least one layer of the convolutional neural network with the approximation of weight values to produce an inference output.

2. The system of claim 1, wherein the compressed weight matrix is formed by matrix factorization and wherein a decompression matrix is stored in the storage device, wherein the decompression module is operable to obtain the approximation of the weight values by decompressing the compressed weight matrix through the decompression matrix.

3. The system of claim 2, wherein the matrix factorization is performed by singular value decomposition.

4. The system of claim 2, wherein the matrix factorization is performed by principal components analysis.

5. The system of claim 1, wherein compressed weight matrix is encoded prior to being stored in the storage device.

6. The system of claim 5, wherein the encoding is a Hoffman encoding procedure.

7. The system of claim 1, wherein the floating point format is a 32-bit single precision floating point number in accordance with the IEE754 standard and the floating point composite is a four-bit value.

8. The system of claim 1, wherein the convolutional neural network is an image classification model including image based inputs and wherein the interference output is a classification of the image.

9. The system of claim 1, wherein the storage device includes a second compressed weight matrix of a second set of weights associated with a second layer of the convolutional neural network, wherein the decompression module is operable to obtain a second approximation of the second set of weights, and wherein the plurality of cores executes the second layer of the convolutional neural network with the second approximation of weight values.

10. A method of executing a layer of a convolutional neural network via a multi-core system having a plurality of cores, the method comprising:
compressing the set of weights by quantization of a floating point format of each weight to a floating point composite;
storing the compressed set of weights in a storage device of a multi-core device configured to execute the convolutional neural network;
configuring one of the plurality of cores as a decompression module operable to obtain an approximation of the weight values by decompressing the compressed weight matrix by expanding the floating point composite of each weight to the floating point format; and
configuring some of the plurality of cores to execute the at least one layer of the convolutional neural network with the approximation of weight values to produce an inference output.

11. The method of claim 10, further comprising:
performing matrix factorization of the set of weights to produce a decompression matrix and a set of factorized weights for the quantization; and
storing the decompression matrix and the compressed set of factorized weights in the storage device.

12. The method of claim 11, wherein the matrix factorization is performed by singular value decomposition.

13. The method of claim 11, wherein the matrix factorization is performed by principal components analysis.

14. The method of claim 10, further comprising encoding the compressed weight matrix.

15. The method of claim 14, wherein the encoding is a Hoffman encoding procedure.

16. The method of claim 10, wherein the floating point format is a 32-bit single precision floating point number in accordance with the IEE754 standard and the floating point composite is a four-bit value.

17. The method of claim 10, wherein the convolutional neural network is an image classification model including image based inputs and wherein the interference output is a classification of the image.

18. The method of claim 10, further comprising:
performing matrix factorization of a second set of weights associated with a second layer of the convolutional neural network to produce a second decompression matrix and a second set of factorized weights;
compressing the second set of factorized weights by quantization of a floating point value of each weight to a floating point format; and
storing the second compressed set of factorized weights and the second decompression matrix in a storage device of a multi-core device configured to execute the second layer of the convolutional neural network.

19. An edge device comprising:
a plurality of cores for executing at least one layer of a convolutional neural network model trained for image classification;
a storage device storing a compressed weight matrix of a set of weights of the at least one layer of the convolutional network model, and a decompression matrix, wherein the compressed weight matrix is formed by matrix factorization and quantization of a floating point format of each weight to a floating point composite;
a decompression module operable to obtain an approximation of the weight values by decompressing the compressed weight matrix by expanding the floating point composite of each weight to the floating point format; and
wherein the plurality of cores execute the at least one layer of the decompressed convolutional neural network with the approximation of weight values to classify an input image, and wherein the compressed weight matrix of the set of weight is stored without having to re-train the convolutional neural network model to maintain model performance.

* * * * *